(12) United States Patent
Kattner et al.

(10) Patent No.: US 6,519,008 B1
(45) Date of Patent: Feb. 11, 2003

(54) FILTER CIRCUIT

(75) Inventors: Axel Kattner, Seevetal (DE); Joachim Brilka, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/310,484

(22) Filed: May 12, 1999

(30) Foreign Application Priority Data

May 15, 1998 (DE) .......................................... 198 21 940
Aug. 14, 1998 (DE) .......................................... 198 36 908

(51) Int. Cl.$^7$ .............................................. H04N 9/475
(52) U.S. Cl. ...................... 348/512; 348/736; 348/462; 348/480; 348/486
(58) Field of Search ................................ 348/512, 711, 348/735–738, 465, 462, 480, 482, 483–486, 607; 381/2, 4, 7; H04N 9/475

(56) References Cited

U.S. PATENT DOCUMENTS

| | | | | |
|---|---|---|---|---|
| 4,322,751 A | * | 3/1982 | Hongu et al. | 348/735 |
| 4,470,070 A | * | 9/1984 | Griffis | 348/737 |
| 4,470,071 A | * | 9/1984 | Rindal | 348/737 |
| 4,490,743 A | * | 12/1984 | Mycynek et al. | 348/737 |
| 4,514,760 A | * | 4/1985 | Balaban et al. | 348/480 |
| 4,514,763 A | * | 4/1985 | Rindal | 348/616 |
| 4,551,756 A | * | 11/1985 | Ogawa et al. | 348/737 |
| 4,654,707 A | * | 3/1987 | Mycynek | 348/485 |
| 4,811,096 A | * | 3/1989 | Gakumura | 331/17 |
| 5,079,525 A | * | 1/1992 | Ishikawa et al. | 332/120 |
| 5,117,195 A | * | 5/1992 | Robbins | 329/307 |
| 5,239,367 A | * | 8/1993 | Sato | 348/571 |
| 5,446,411 A | * | 8/1995 | Horsfall et al. | 329/325 |
| 5,483,297 A | * | 1/1996 | Song | 348/737 |
| 5,503,159 A | * | 4/1996 | Burton | 600/516 |
| 5,553,623 A | * | 9/1996 | Ochs | 600/523 |
| 5,644,368 A | * | 7/1997 | Natsume | 348/732 |
| 5,802,462 A | * | 9/1998 | Lautzenhiser | 331/23 |
| 5,995,169 A | * | 11/1999 | Hatano | 348/555 |
| 6,008,693 A | * | 12/1999 | Heinke | 329/321 |
| 6,177,964 B1 | * | 1/2001 | Birleson et al. | 348/725 |
| 6,232,900 B1 | * | 5/2001 | Hendricks et al. | 341/118 |
| 6,233,023 B1 | * | 5/2001 | Hatano | 348/731 |

\* cited by examiner

*Primary Examiner*—John Miller
*Assistant Examiner*—Linus H. Lo
(74) *Attorney, Agent, or Firm*—Steven R. Biren

(57) ABSTRACT

For an optimal adjustment of the filter frequency of a signal filter, independently of external influences, process spreads and temperature fluctuations, a filter circuit for filtering at least one sound carrier in a composite video signal by at least one signal filter (24) having at least one filter frequency which is adjustable in dependence upon a control signal, is characterized in that the filter circuit (1) includes a reference filter (11) whose filter frequency is adjustable in dependence upon the control signal and which shifts the phase of a reference signal applied thereto by a defined value when tuning the filter frequency to the frequency of said reference signal, in that a phase comparator (14) is provided which receives the output signal of the reference filter (11) and the reference signal, in that the control signal is derived from the output signal of the phase comparator (14) in such a way that the reference filter (11) is tuned to the frequency of the reference signal, and in that an output signal of a controlled oscillator (35) of a phase-locked loop (3) is used as a reference signal which serves for demodulating a sound signal modulated on the sound carrier and whose controlled oscillator (35) supplies an output signal at the frequency of the sound carrier in the locked state of the phase-locked loop (3).

12 Claims, 2 Drawing Sheets

FILTER CIRCUIT

BACKGROUND OF THE INVENTION

1. Field of the Invention

The invention relates to a filter circuit for filtering at least one sound carrier in a composite video signal by means of at least one signal filter having at least one filter frequency which is adjustable in dependence upon a control signal.

2. Description of the Related Art

A problem in such filter circuits is that the frequency of the sound carrier may assume different values within a range between approximately 4.5 and 6.5 MHz for composite video signals of different standards. The circuit should therefore be implemented in such a way that it can filter these different sound carrier frequencies. To this end, ceramic filters may be used between which switching takes place in dependence upon the transmission standard; however, such a circuit is very elaborate.

A filter circuit for a video signal whose frequency can be switched in dependence upon the presence of either a PAL or an NTSC video signal is known from U.S. Pat. No. 5,239,367. To this end, a reference filter is used which operates at a reference frequency and whose output signal is applied to a phase discriminator which also receives the reference signal at a further input. Dependent on the phase position of the two signals applied to the phase discriminator, the filter frequency of the reference filter is readjusted by means of the output signal of the phase discriminator in such a way that the filter is tuned to the reference frequency of the reference signal. In this state, the reference filter shifts the phase position of the reference signal applied thereto by such a value that no further readjustment takes place anymore. The signal with which the reference filter is readjusted is used for activating a switch which switches different current sources to the signal filter so that its filter frequency is switched.

Apart from the fact that the frequency position, of the signal filter of this circuit arrangement is switchable only between two frequency positions and that the circuit, after all, serves more for recognizing the PAL/NTSC standard and the corresponding switching of the signal filter, it has the additional drawback that the circuit can be optimized only for a given process state. By switching to different frequencies, the reference filter operates in other frequency positions than the signal filter. Furthermore, the overall circuit can only be optimized for a given temperature; by varying the chip temperature, spreads in the frequency position of the signal filter occur as before and may render the circuit unusable.

SUMMARY OF THE INVENTION

It is an object of the invention to provide a filter circuit of the type described in the opening paragraph, in which the signal filter operates at an adjustable nominal signal frequency, also while taking spreads in the manufacturing process of the circuit into account, independently of the temperature at which the circuit is operated and independently of the frequency position of the signal filter.

According to the invention, this object is achieved in that the filter circuit comprises a reference filter whose filter frequency is adjustable in dependence upon the control signal and which shifts the phase of a reference signal applied thereto by a defined value when tuning the filter frequency to the frequency of said reference signal, in that a phase comparator is provided which receives the output signal of the reference filter and the reference signal, in that the control signal is derived from the output signal of the phase comparator in such a way that the reference filter is tuned to the frequency of the reference signal, and in that an output signal of a controlled oscillator of a phase-locked loop is used as a reference signal which serves for demodulating a sound signal modulated on the sound carrier and whose controlled oscillator supplies an output signal at the frequency of the sound carrier in the locked state of the phase-locked loop.

The reference filter which receives the reference signal shifts this signal by a defined value when tuning the filter frequency to the frequency of this reference signal. The phase comparator receives both the phase-shifted reference signal and the original reference signal. The output signal of the phase comparator is used for readjusting the reference filter. The same control signal is also used for continuously readjusting the filter frequency of the signal filter. This signal is implemented in such a way that the reference filter is tuned to the frequency of the signal applied thereto. Thus, spreads, temperature fluctuations, etc., are stabilized and compensated by readjusting the reference filter. In a corresponding manner, the signal filter is also readjusted.

In the prior-art circuits, such a circuit can be optimized for only one frequency position. However, if the signal filter is to operate at various frequencies, which may deviate from the operating frequency of the reference filter, external effects influence the circuit as regards the ratio between the frequency of the signal filter and the frequency of the reference filter. Dependent on the operating frequency of the signal filter, these effects occur in different ways in the two filters so that the signal filter can no longer be readjusted optimally. Also, process spreads of temperature affect the frequency position of the signal filter; when the signal filter operates at a different frequency than the reference filter, these effects on the filters are also different so that an optimum readjustment is no longer possible.

For a substantial elimination of these drawbacks, the output signal of a controlled oscillator of a phase-locked loop is used as a reference signal. This phase-locked loop receives the composite video signal which is also applied to the signal filter of the filter circuit. This phase-locked loop serves for demodulating the sound signal modulated on the sound carrier. In its locked state, the phase-locked loop operates at the frequency of the sound carrier. The voltage-controlled oscillator of this phase-locked loop thus supplies a signal which exactly corresponds to the frequency of the sound carrier to be filtered in the composite video signal.

Since this signal is used as a reference signal for the reference filter, it is achieved that both the reference filter and the signal filter always operate at the same frequency, namely, at the frequency of the sound carrier to be filtered. The above-described effects, process spreads and temperature fluctuations thus influence the two filters in similar ways. Not only the readjustment of the reference filter then succeeds optimally under different external effects, but also that of the signal filter, because it operates at the same filter frequency.

As a result, it is achieved that the filter circuit always operates optimally also at different filter frequencies, i.e., the signal filter is always optimally adjustable at the frequency of the sound carrier to be filtered. Moreover, the advantage is obtained that it is no longer necessary to generate an additional switching signal for switching the signal filter.

These advantages may be even further enhanced in that, by building up the reference filter in the same technique as the signal filter, and by influencing the filter frequency of the reference filter by the control signal in the same way as the filter frequency of the signal filter, both the reference filter and the signal filter have the same technical structure so that process spreads, temperature fluctuations and other influences have the same effect on both filters.

The control signal may be generated from the output signal of the phase comparator such that two current sources, or one bidirectional current source, charge or discharge a capacitance with currents of different signs in dependence upon the output signal of the phase comparator, and in that a comparator is provided which supplies the voltage across the capacitance at a first input and receives a reference voltage at a second input, and supplies the control signal at the output, referring to a simple circuit for generating the control signal.

The phase-locked loop, from which the reference signal is obtained, may be preferably a narrow-band phase-locked loop, which has no amplitude limitation but an amplitude control and is implemented in such a way that it has its own selectivity.

For example, if no sound carrier were present in the composite video signal, the phase-locked loop could not lock at such a sound carrier. In this case, it is advantageous to maintain the frequency of the controlled oscillator of the phase-locked loop in a nominal frequency range by means of a fine-tuning circuit. It is thereby achieved for the filter circuit according to the invention that, in such a case, the signal filter is also maintained in a nominal frequency range.

A further embodiment of the invention, is characterized in that integrator filters are used for the signal filter and for the reference filter. Their integrator elements are advantageously built up in the same technique. Even when filters of different orders were used, the above-described influences on the filters would have the same effect.

These and other aspects of the invention are apparent from and will be elucidated with reference to the embodiments described hereinafter.

DESCRIPTION OF THE PREFERRED EMBODIMENTS

Figure 1:
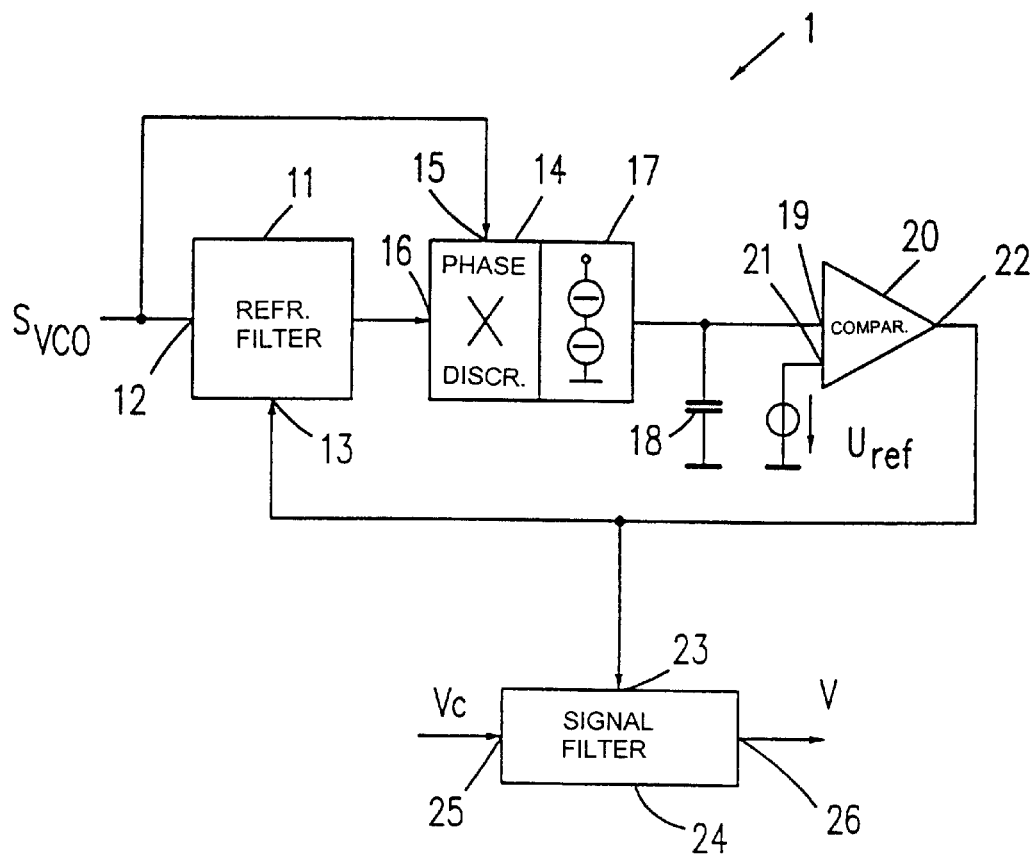
FIG. 1 shows an embodiment of a filter circuit according to the invention, without generation of the reference signal.

A circuit diagram of a filter circuit 1 shown in FIG. 1 illustrates this circuit with all essential elements but without the phase-locked loop for gaining the reference signal.

The filter circuit 1 comprises a reference filter 11 which receives a reference signal $S_{VCO}$ at a first input 12. This signal originates from a phase-locked loop (PLL) which will be described hereinafter with reference to FIG. 2.

The reference filter 11 proceeds a PLL 14 which receives the unchanged reference signal $S_{VCO}$ at a first input 15. A second input 16 of the phase discriminator 14 receives the output signal of the reference filter 11.

The output signal of the phase discriminator 14 is used for controlling a bidirectional current source 17 which, in dependence upon the sign and value of the output signal of the phase discriminator 14, supplies currents of different signs and different values. These currents are applied to a capacitor 18 which is thereby charged or discharged. The voltage across the capacitor 18 is applied to a first input 19 of a comparator 20 which receives a reference voltage $U_{ref}$ at a second input 21. The output 22 of the comparator 20 supplies a control signal which is applied to a control input 13 of the reference filter 11. The filter frequency of the reference filter 11 is adjusted in dependence upon this control signal.

The control signal is further applied to a control input 23 of a signal filter 24. Also the filter frequency of this signal filter 24 is adjustable in dependence upon the control signal. The signal filter 24 is used for filtering one or more sound carriers in a composite video signal. The video components of the composite video signal are in the baseband; the sound carrier is on a second IF sound carrier frequency.

The signal filter 24 receives the composite video signal $V_C$ at an input 25. An output 26 of the signal filter 24 supplies the filtered signal which no longer comprises the sound carrier and is denoted by V in FIG. 1.

The operation of this circuit is characterized in that the filter frequency of the reference filter is always adjusted in dependence upon the control signal, such that it corresponds to the frequency of the reference signal $S_{VCO}$. In dependence upon the control signal, the filter frequency of the signal filter 24 is thus also adjusted, accordingly.

This is achieved as follows.

The reference filter 11 is implemented in such a way that it shifts the phase of the signal applied thereto by a defined value, preferably by the value of 90° when tuning its filter frequency to the frequency of this signal. If this value is achieved in the input signals of the phase discriminator 14, its output signal reaches the value of zero so that the bidirectional current source 17 is not controlled. However, if the phase deviation differs from the predetermined value, for example 90°, the phase discriminator 14 will supply a corresponding output signal which, dependent on the sign of the phase deviation, controls the bidirectional current source 17 so that, dependent on the sign of the phase deviation, the capacitor 18 is either charged or discharged. A correspondingly higher or lower voltage thus occurs at the input 19 of the comparator 20. After comparison with the reference voltage, the comparator 20 supplies an output signal which is a measure of the extent to which the phase position of the output signal of the reference filter deviates from the predetermined nominal phase position. This is also a measure of the extent to which the filter frequency of the reference filter is not exactly tuned to the frequency of the reference signal $S_{VCO}$. The control signal of the reference filter thus, allows fine-tuning until the nominal phase relation is restored again, thus until the reference filter is exactly tuned to the frequency of the reference signal $S_{VCO}$ and supplies a signal with the nominal phase shift at its output.

In this way, the filter frequency of the reference filter can be continually readjusted in such a way that it corresponds to the frequency of the reference signal. External effects, process spreads and temperature influences can thereby be eliminated. In a corresponding manner, the filter frequency of the signal filter 24 is also readjusted by the control signal.

However, for filtering the composite video signals $V_C$, it may be desirable to filter sound carriers of different frequencies in signals of different transmission standards. This means that the signal filter 24 must be tuned to different frequencies. In the simplest case, this could be done by superimposing switching components on the control signal applied to the signal filter 24, which components effect a corresponding detuning of the signal filter. However, this would have the drawback that the above-described effects on the signal filter have a different effect on the reference filters because the signal filter operates at a different frequency. Actually, they would become manifest in the ratio between frequencies of the signal filter and the reference filter. The signal filter would then no longer be tuned exactly to the frequency of the relevant sound carrier.

To solve this problem, the invention ensures that the reference filter 11 and the signal filter 24 operate at the same frequency. This is achieved in that an output signal of a PLL is used as a reference signal $S_{VCO}$ which signal is used for demodulating the sound signal modulated on the sound carrier. This signal must have the frequency of the sound carrier and is used as a reference signal. The reference signal thus has the same frequency as that sound carrier in the composite video signal Vc which is to be filtered by means of the signal filter 24. In the tuned state, both filters consequently operate at the same frequency so that the above-mentioned influences have the same effect on both filters.

Figure 2:
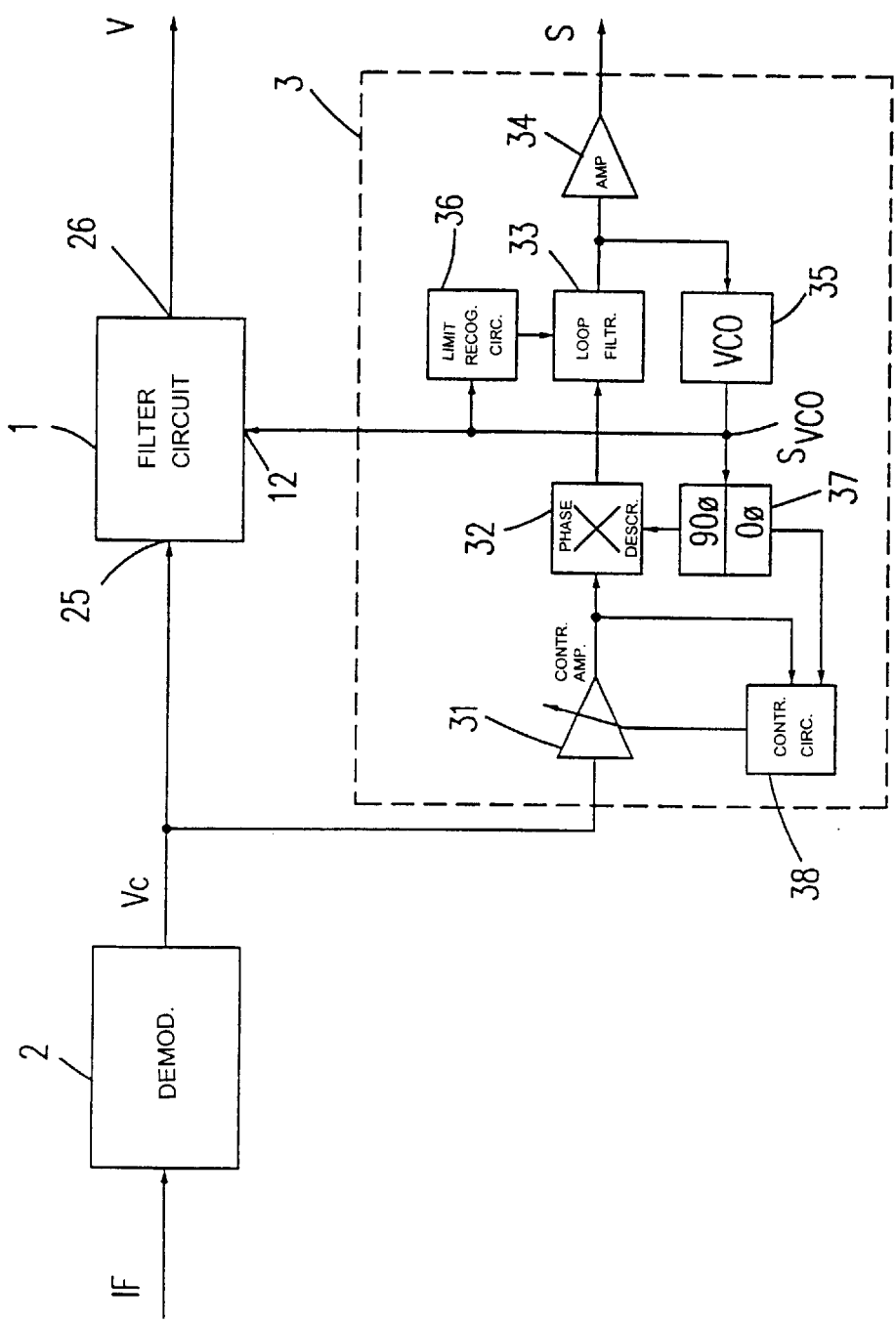
FIG. 2 is a circuit diagram of a TV receiver with a video demodulator, the filter circuit of FIG. 1 and a phase-locked loop for demodulating the sound signals and for gaining the reference signal.

FIG. 2 shows partly a block diagram and partly a detailed form of an input circuit of a TV receiver in which a PLL 3 is indicated, whose signal is used as a reference signal $S_{VCO}$ in the filter circuit of FIG. 1.

An intermediate frequency video signal IF is applied to the input of the overall circuit of FIG. 2. This signal comprises a video component and a sound carrier component both of which occur in the intermediate frequency range. This signal is applied to a demodulator 2 which converts this signal into a composite video signal in which the video signal occurs in the baseband and the sound carrier occurs at a second IF sound carrier frequency.

This signal is the signal which is to be filtered by the filter circuit of FIG. 1, or by the signal filter 24, in this circuit in such a way that the sound carrier in this signal is suppressed. To this end, this signal is applied to the input 25 of the signal filter in the filter circuit of FIG. 2. The filtered video signal V in which the sound carrier(s) is (are) suppressed is supplied from the output 26 of the signal filter in the filter circuit 1.

The composite video signal, which is supplied by the demodulator 2, is also applied to a narrow-band PLL 3 which is used for demodulating the sound signal(s) modulated on the sound carrier(s). The output of the narrow-band PLL 3 supplies one or more demodulated sound signals S.

A narrow-band PLL has its own selectivity. This is essentially achieved in that the signal applied thereto is not limited in amplitude but is instead amplitude-controlled. Furthermore, the voltage-controlled oscillator of the PLL is maintained in a nominal frequency range so that the PLL is held in this nominal frequency range when it is in its unlocked state.

In FIG. 2, the composite video signal $V_C$ is applied to a controllable amplifier 31 which precedes a phase discriminator 32. The output signal of the phase discriminator 32 is applied to a loop filter 33 which precedes an amplifier 34 supplying the demodulated sound signal S.

Furthermore, the output signal of the loop filter 33 is applied to a voltage-controlled oscillator 35 which supplies an output signal which is applied to a phase-shifting circuit 37. The circuit 37 has two outputs, at a first output of which the signal $S_{VCO}$ occurs in an unshifted phase position, which signal is applied to a control circuit 38. The circuit 37 also supplies a 90° shifted signal which is applied to a second input of the phase discriminator 32.

A further input of the control circuit 38, which controls the controllable amplifier 31 and maintains its output signal in a nominal amplitude range, receives the output signal from the controllable amplifier 31.

Furthermore, a limit-recognition circuit 36 is provided which receives the output signal from the voltage-controlled oscillator 35 and supplies a control signal to the loop filter 33, maintaining the frequency of the voltage-controlled oscillator 35 in a nominal frequency range in the unlocked state of the narrow-band PLL 3.

The narrow-band PLL 3 has its own selectivity. In the steady-state condition, it is achieved by the input-sided amplitude control that the narrow-band PLL 3 always oscillates at the frequency of the sound carrier in the composite video signal $V_C$. If there is no input signal, or if there is no sound carrier in this signal, the limit-recognition circuit 36 ensures that the $S_{VCO}$ always operates in the nominal frequency range.

The output signal of the voltage-controlled oscillator 35 thus always supplies a signal having a frequency which corresponds to the frequency of the sound carrier in the composite video signal. This frequency thus always corresponds to the filter frequency of the signal filter 24 of the filter circuit shown in FIG. 1. According to the invention, the output signal of the voltage-controlled oscillator 35 is therefore used as a reference signal 12. In the filter circuit shown in FIG. 1, it is thereby achieved that both the reference filter and the signal filter operate at the same frequency. The fine-tuning is then realized optimally, because not only the reference filter but also the signal filter is fine-tuned optimally. The effects described above influence both filters in the same way so that these effects can be stabilized in the same way for both filters. As a result, it is achieved that the signal filter of the filter circuit 1 shown in FIG. 1 is always exactly tuned to the frequency of the sound carrier to be filtered.

What is claimed is:

1. A filter circuit for filtering at least one sound carrier in a composite video signal by means of at least one signal filter (24) having at least one filter frequency which is adjustable in dependence upon a control signal, characterized in that the filter circuit (1) comprises a reference filter (11) whose filter frequency is adjustable in dependence upon the control signal and which shifts the phase of a reference signal applied thereto by a defined value when tuning the filter frequency to the frequency of said reference signal, in that a phase comparator (14) is provided which receives the output signal of the reference filter (11) and the reference signal, in that the control signal is derived from the output signal of the phase comparator (14) in such a way that the reference filter (11) is tuned to the frequency of the reference signal, in that an output signal of a controlled oscillator (35) of a phase-locked loop (3) is used as a reference signal which serves for demodulating a sound signal-modulated on the sound carrier and whose controlled oscillator (35) supplies an output signal at the frequency of the sound carrier in the locked state of the phase-looked loop (3), and wherein for generating the control signal, the filter circuit further comprises two current sources coupled to receive the output signal of the phase comparator; a capacitance coupled to said two current sources, said two current sources charging or discharging the capacitance with currents of different signs in dependence upon the output signal of the phase comparator, and a comparator having a first input for receiving a voltage across the capacitance a second input for receiving a reference voltage, and an output for supplying the control signal.

2. A filter circuit as claimed in claim 1, characterized in that said phase-locked loop comprises a narrow-band phase-locked loop having its own selectivity.

3. A filter circuit as claimed in claim 1, characterized in that the phase-locked loop further comprises a fine tuning circuit for maintaining the frequency of the controlled oscillator of the phase-locked loop in a nominal frequency range during periods of time in which no sound carrier is present in the composite video signal.

4. A filter circuit as claimed in claim 1, characterized in that the reference filter shifts the phase of the reference signal by 90° when tuning to the frequency of said reference signal.

5. A filter circuit as claimed in claim 1, characterized in that a first third-order integrator filter and a second and third second-order integrator filter are provided as signal filters.

6. A filter circuit for filtering at least one sound carrier in a composite video signal by means of at least one signal filter (24) having at least one filter frequency which is adjustable in dependence upon a control signal, characterized in that the filter circuit (1) comprises a reference filter (11) whose filter frequency is adjustable in dependence upon the control signal and which shifts the phase of a reference signal applied thereto by a defined value when tuning the filter frequency to the frequency of said reference signal, in that a phase comparator (14) is provided which receives the output signal of the reference filter (11) and the reference signal, in that the control signal is derived from the output signal of the phase comparator (14) in such a way that the reference filter (11) is tuned to the frequency of the reference signal, in that an output signal of a controlled oscillator (35) of a phase-locked loop (3) is used as a reference signal which serves for demodulating a sound signal modulated on the sound carrier and whose controlled oscillator (35) supplies an output signal at the frequency of the sound carrier in the locked state of the phase-locked loop (3), integrator filters comprising integrator elements of the same construction are provided as signal filter (24) and as reference filter (11), and wherein the first and the second integrator filter are implemented for filtering a first sound carrier, and in that the third integrator filter is implemented for filtering a second sound carrier having a smaller amplitude than the first sound carrier.

7. An integrator filter circuit as claimed in claim 1, characterized in that the reference filter (11) is built up in the same technique as the signal filter (24) and that the filter frequency of the reference filter (11) can be influenced by the control signal in the same way as the filter frequency of the signal filter (24).

8. An integrator filter circuit as claimed in claim 6, characterized in that the reference filter (11) is built up in the same technique as the signal filter (24) and that the filter frequency of the reference filter (11) can be influenced by the control signal in the same way as the filter frequency of the signal filter (24).

9. A filter circuit as claimed in claim 6, characterized in that a narrow-band phase-locked loop having its own selectivity is provided as a phase-locked loop (3).

10. A filter circuit as claimed in claim characterized in that during those periods in which no sound carrier is present in the composite video signal, the frequency of the controlled oscillator (35) of the phase-locked loop is maintained in a nominal frequency range by means of a fine-tuning circuit (36).

11. A filter circuit as claimed in claim 6, characterized in that the reference filter (11) shifts the phase of the reference signal applied thereto by 90° when tuning to the frequency of said reference signal.

12. A filter circuit as claimed in claim 6, characterized in that a first third-order integrator filter and a second and third second-order integrator filter are provided as signal filters.

\* \* \* \* \*